(12) United States Patent  (10) Patent No.: US 8,765,494 B2
Hiraoka et al.  (45) Date of Patent: Jul. 1, 2014

(54) METHOD FOR FABRICATING ORGANIC EL DEVICE AND METHOD FOR EVALUATING ORGANIC EL DEVICE

(71) Applicant: Panasonic Corporation, Osaka (JP)

(72) Inventors: Tomomi Hiraoka, Hyogo (JP); Yasuo Segawa, Hyogo (JP)

(73) Assignee: Panasonic Corporation, Osaka (JP)

( * ) Notice: Subject to any disclaimer, the term of this patent is extended or adjusted under 35 U.S.C. 154(b) by 41 days.

(21) Appl. No.: 13/693,335

(22) Filed: Dec. 4, 2012

(65) Prior Publication Data

US 2013/0102094 A1  Apr. 25, 2013

Related U.S. Application Data

(63) Continuation of application No. PCT/JP2011/005226, filed on Sep. 15, 2011.

(51) Int. Cl.
*H01L 21/66* (2006.01)

(52) U.S. Cl.
USPC ............. 438/7; 438/99; 438/796; 257/E21.53

(58) Field of Classification Search
CPC ................................ H01L 22/12; H01L 22/24
USPC ............................ 438/7, 99, 796; 257/E21.53
See application file for complete search history.

(56) References Cited

U.S. PATENT DOCUMENTS 7,234,984 B2  6/2007  Nishikawa et al.
7,258,586 B2  8/2007  Tamura et al.
7,611,745 B2  11/2009  Nishikawa et al.
(Continued)

FOREIGN PATENT DOCUMENTS

JP  2-152192  6/1990
JP  2004-227852  8/2004
(Continued)

OTHER PUBLICATIONS

U.S. Appl. No. 13/659,084 to Tomomi Hiraoka, filed Oct. 24, 2012.
(Continued)

*Primary Examiner* — George Fourson, III
(74) *Attorney, Agent, or Firm* — Greenblum & Bernstein, P.L.C.

(57) ABSTRACT

An organic EL device (OELD) having a defective portion is irradiated with a laser beam; first luminance of light emitted from the OELD is measured after the OELD is irradiated with the laser beam, while supplying, to the OELD, a first amount of current with which the OELD in a normal state would emit light having luminance corresponding to a first grayscale level smaller than a reference level; the OELD is re-irradiated with the laser beam when the first luminance is smaller than a threshold; and second luminance of light emitted from the OELD is measured when the first luminance is greater than or equal to the threshold, while supplying, to the OELD, a second amount of current with which the OELD in the normal state would emit light having luminance corresponding to a second grayscale level greater than or equal to the reference level.

4 Claims, 8 Drawing Sheets

(56) References Cited

U.S. PATENT DOCUMENTS

| | | | |
|---|---|---|---|
| 7,838,858 B2* | 11/2010 | Okita | 250/559.44 |
| 8,197,334 B2* | 6/2012 | Chudd et al. | 463/25 |
| 8,283,661 B2 | 10/2012 | Miyazawa et al. | |
| 8,531,477 B2* | 9/2013 | Jiang et al. | 345/605 |
| 8,552,299 B2* | 10/2013 | Rogers et al. | 174/254 |
| 2003/0222861 A1 | 12/2003 | Nishikawa et al. | |
| 2004/0202777 A1 | 10/2004 | Nishikawa et al. | |
| 2005/0215163 A1 | 9/2005 | Tamura et al. | |
| 2006/0274021 A1* | 12/2006 | Park et al. | 345/100 |
| 2011/0227104 A1 | 9/2011 | Miyazawa et al. | |
| 2012/0264235 A1 | 10/2012 | Hiraoka et al. | |
| 2012/0320294 A1* | 12/2012 | Kim et al. | 349/41 |
| 2013/0102094 A1* | 4/2013 | Hiraoka et al. | 438/16 |

FOREIGN PATENT DOCUMENTS

| | | |
|---|---|---|
| JP | 2005-276600 | 10/2005 |
| JP | 2006-323032 | 11/2006 |
| JP | 2007-042498 | 2/2007 |
| JP | 2008-034264 | 2/2008 |
| JP | 2011-090889 | 5/2011 |
| JP | 2011-134490 | 7/2011 |
| WO | 2010/122782 | 10/2010 |

OTHER PUBLICATIONS

International Search Report in PCT/JP2011/005226, dated Oct. 11, 2011.

* cited by examiner

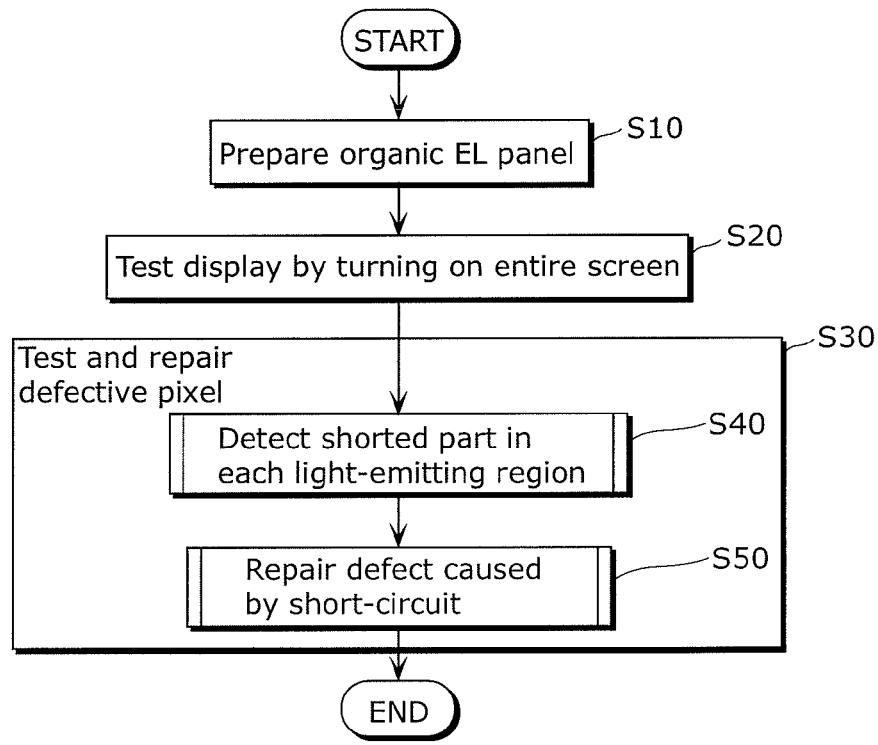
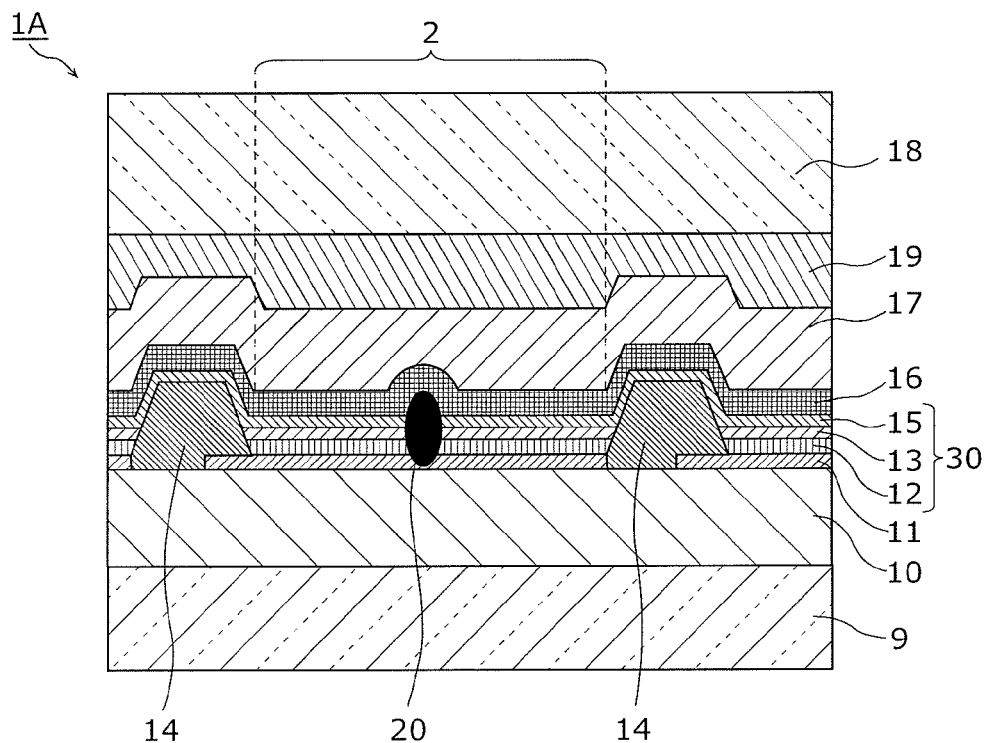

METHOD FOR FABRICATING ORGANIC EL DEVICE AND METHOD FOR EVALUATING ORGANIC EL DEVICE

CROSS REFERENCE TO RELATED APPLICATION

This is a continuation application of PCT Patent Application No. PCT/JP2011/005226 filed on Sep. 15, 2011, designating the United States of America. The entire disclosure of the above-identified application, including the specification, drawings and claims is incorporated herein by reference in their entirety.

TECHNICAL FIELD

One or more exemplary embodiments disclosed herein relate generally to a method for fabricating an organic electroluminescence device.

BACKGROUND ART

Conventionally, in an organic electroluminescence (hereafter referred to as organic EL) device including an anode, a cathode, and an organic layer disposed between the anode and the cathode, there is a case in which a conductive foreign material is attached or mixed during the fabrication process. This could lead to undesirable short-circuit (leakage) between the anode and the cathode, causing light-emission defect in the organic EL device.

In this case, there is a known method for repairing the defect due to short-circuit, by increasing resistance of a shorted part or a target region determined around the shorted region by laser irradiation (for example, see the patent literature 1).

The patent literature 1 discloses a technique for recovering the light-emission function of the organic EL device by irradiating the electrodes around the foreign material in the organic EL device with laser so as to separate the electrode into a region contacting the foreign material and a region not contacting the region or the foreign material.

Furthermore, in a technique according to the patent literature 2, the leakage part is specified from weak light emitted from a flat-panel display device when a reverse-bias voltage is applied, and the specified leakage part is irradiated with a laser beam. With this, the defect in light emission caused by the leakage is repaired.

CITATION LIST

Patent Literature

[Patent Literature 1] Japanese Unexamined Patent Application Publication No. 2005-276600
[Patent Literature 2] Japanese Unexamined Patent Application Publication No. 2006-323032

SUMMARY

Technical Problem

Conventionally, the techniques for repair have been known. However, there is a problem that the accuracy of the test for determining whether the repair was successful or not is not sufficient.

One non-limiting and exemplary embodiment provides a method for fabricating the organic EL device including an evaluation method capable of evaluating whether or not the repair is successful when the light-emission defect caused by the short-circuit in the organic EL device is repaired by irradiating the organic EL device with the laser beam.

Solution to Problem

In one general aspect, the method for fabricating the organic EL device disclosed here feature a method for fabricating an organic electroluminescence (EL) device, and the method includes: irradiating an organic EL device having a defective portion with a laser beam; measuring first luminance of light emitted from the organic EL device after the organic EL device is irradiated with the laser beam, while supplying, to the organic EL device, a first amount of current with which the organic EL device in a normal state would emit light having luminance corresponding to a first grayscale level smaller than a reference grayscale level; re-irradiating the organic EL device with the laser beam when the first luminance measured in the measuring is smaller than a determination threshold; and measuring second luminance of light emitted from the organic EL device when the first luminance measured in the measuring is greater than or equal to the determination threshold, while supplying, to the organic EL device, a second amount of current with which the organic EL device in the normal state would emit light having luminance corresponding to a second grayscale level greater than or equal to the reference grayscale level.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the method for fabricating the organic EL device, luminance of the light in a low grayscale level is measured prior to the conventional test in which the luminance of light in a high grayscale level is measured. Accordingly, it is possible to securely find the light-emitting device on which the laser repairing is incomplete, and repairing the device.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 3 is a flowchart illustrating an example of the method for fabricating the organic EL device according to the embodiment.

FIG. 4 is a schematic cross-sectional diagram illustrating an example of the organic EL device prepared in the embodiment.

FIG. 8 (b) is a graph illustrating low grayscale level in FIG. 8 (a) enlarged.

DESCRIPTION OF EMBODIMENT(S)

Knowledge Underlying the Present Disclosure

Figure 1:
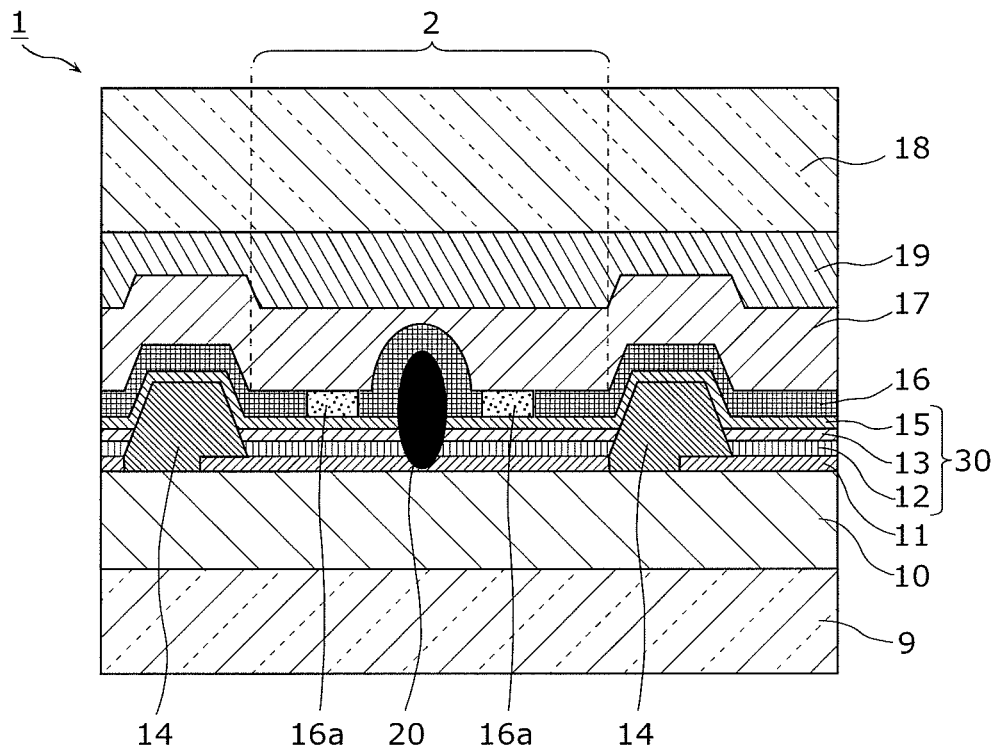
FIG. 1 is a schematic cross-sectional diagram illustrating an example of the organic EL device according to the embodiment.

The inventors found out the following problem after the repair disclosed in the Background Art is performed.

One requirement for the successful repair is that the maximum luminance of the light emitted from the repaired organic EL device recovers to a level greater than or equal to an acceptable threshold value. Accordingly, typically, in the conventional repair, a test for checking the luminance of the light emission is performed after applying a luminance signal of high grayscale level (for example, around the maximum grayscale level) on the repaired organic EL device.

The high grayscale level light-emission test is performed by checking the light-emission of a normal intensity using visible light. Accordingly, the test can be easily performed either as visual checking by a test worker or mechanical auto-recognition. This significantly contributes to simplifying the repair process and increasing the efficiency of the repair process.

However, the inventors noticed that even if the maximum light-emission luminance has recovered to the acceptable level in the high grayscale level light-emission test, there are organic EL elements not emitting light at all or emitting light having extremely low luminance, when a luminance signal of a lower grayscale level is given. Missing the defect in the light-emission at the low grayscale level could be a cause to deteriorated reliability of repair, which is a significant problem.

One non-limiting and exemplary embodiment provides a method for fabricating the organic EL device including an evaluation method capable of evaluating whether or not the repair is successful when the light-emission defect caused by the short-circuit in the organic EL device is repaired by irradiating the organic EL device with the laser beam.

The method for fabricating the organic EL device according to an aspect of the present disclosure includes: irradiating an organic EL device having a defective portion with a laser beam; measuring first luminance of light emitted from the organic EL device after the organic EL device is irradiated with the laser beam, while supplying, to the organic EL device, a first amount of current with which the organic EL device in a normal state would emit light having luminance corresponding to a first grayscale level smaller than a reference grayscale level; re-irradiating the organic EL device with the laser beam when the first luminance measured in the measuring is smaller than a determination threshold; and measuring second luminance of light emitted from the organic EL device when the first luminance measured in the measuring is greater than or equal to the determination threshold, while supplying, to the organic EL device, a second amount of current with which the organic EL device in the normal state would emit light having luminance corresponding to a second grayscale level greater than or equal to the reference grayscale level.

According to the method for fabricating the organic EL device, luminance of the light in the low grayscale level is measured prior to the conventional test in which the luminance of the light in the high grayscale level is measured. Accordingly, it is possible to accurately find the light-emitting device on which the laser repairing is incomplete, and repairing the device.

In the method for fabricating the organic EL device, the determination threshold for the first luminance may be 50% of luminance corresponding to the first grayscale level of the light emitted from the organic EL device in the normal state.

The organic EL device having luminance of the light less than half the luminance of the normal organic EL device is especially likely to be recognized by the user. Accordingly, it is effective to select such an organic EL device and attempt the re-repair by the laser re-irradiation.

In the method for fabricating the organic EL device, the first grayscale level may be a grayscale level corresponding to the light emitted from the organic EL device in the normal state having a luminance of 1 $cd/m^2$.

The luminance 1 $cd/m^2$ of the light emitted is an example of an upper limit value of the luminance substantially recognized as black by the user, and the user recognizes light with any luminance lower than or equal to 1 $cd/m^2$ as black.

Accordingly, in the grayscale level with which the normal organic EL device would emit light having luminance of 1 $cd/m^2$, if the luminance of the light emitted from the organic EL device after repair is recovered to 50% of the normal luminance, that is, at 0.5 $cd/m^2$, it is acceptable to have insufficient luminance of light emitted from the repaired organic EL device in a lower grayscale level which is simply recognized as black by the user.

Note that, the upper limit value of the luminance substantially recognized as black uniformly by the user significantly differs depending on the capacity, usage, and use environment of the display apparatus including the organic EL panel incorporated therein. Accordingly, the specific value of the first grayscale level should be appropriately selected depending on the capacity, usage, and use environment of the display apparatus.

In the method for fabricating the organic EL device, the second grayscale level may be a grayscale level around a maximum grayscale level of the organic EL device.

The high-grayscale level light-emission test performed near the maximum grayscale level checks whether the maximum light emission luminance greater than or equal to the acceptable threshold is restored in the organic EL device after the laser irradiation, and also serves as a tolerance test for checking whether or not the tolerance of the organic EL device is degraded by the laser irradiation. Accordingly, this is significantly helpful for simplifying and increasing the efficiency of the repair process.

The following shall describe the method for fabricating the organic EL device according to the embodiment and the organic EL device fabricated by the fabrication method shall be described with reference to the drawings. Note that, in the following description, the same reference numerals are assigned to the same or corresponding elements throughout the drawings, and overlapping description for these elements is omitted.

Embodiment 1

Device Configuration

FIG. 1 is a cross-sectional schematic diagram according to the embodiment 1. The organic EL device 1 illustrated in FIG. 1 is an organic functional device including an organic layer having an anode, a cathode, and a light-emitting layer disposed between the anode and the cathode.

As illustrated in FIG. 1, the organic EL device 1 includes a planarizing film 10, an anode 11, a hole injection layer 12, a light-emitting layer 13, a bank 14, an electron injection layer 15, a cathode 16, a thin-film sealing layer 17, a sealing resin layer 19, and a transparent glass 18 provided above a transparent glass 9.

The anode 11 and the cathode 16 correspond to the lower electrode layer and the upper electrode layer according to the present disclosure, respectively. The hole injection layer 12, the light-emitting layer 13, and the electron injection layer 15 correspond to the organic layer according to the present disclosure.

Transparent glasses 9 and 18 are substrates for protecting the light-emitting surface of the light-emitting panel, and is a transparent alkali-free glass having a thickness of 0.5 mm, for example.

The planarizing film 10 is made of an insulating organic material, and is formed on a substrate including driving thin-film transistors (TFT).

The anode 11 receives holes, that is, a flow of current from an external circuit, and formed of a reflective electrode made of Al, a silver alloy APC, or others stacked on the planarizing film 10. The thickness of a reflective electrode is 10 nm to 40 nm, for example. Note that, the anode 11 may be a two-layered structure formed of indium tin oxide (ITO), a silver alloy APC, and others, for example. As illustrated above, by forming the anode 11 with a highly reflective material such as APC, the irradiated laser beam is reflected on the highly reflective metal. Accordingly, it is possible to focus the laser beam on a layer to be focused highly efficiently.

The hole injection layer 12 is a layer having a hole injecting material as a major component. The hole injecting material is a material having a function for stably injecting holes injected from the side of the anode 11 into the light-emitting layer 13, or supporting the generation of the holes and injecting the holes on the light-emitting layer 13. For example, compounds such as Poly (3, 4-ethylenedioxythiophene) (PEDOT) and aniline have been used.

The light-emitting layer 13 is a layer which emits light by an application of a voltage between the anode 11 and the cathode 16, and is a stacked structure including a lower layer, α-NPD(Bis[N-(1-naphthyl)-N-phenyl]benzidine) and an upper layer, Alq3(tris-(8-hydroxyquinoline)aluminum).

The electron injection layer 15 is a layer having an electron injecting material as a major component. The material having electron injecting property is a material having a function for injecting the electrons injected from the cathode 16 stably, or supporting the generation of the electrodes and injecting the electrons into the light-emitting layer 13, and Poly(p-phenylene vinylene) (PPV) is used, for example.

The cathode 16 receives supply of electrons, that is, is a cathode from which current flows to the external circuit, and has a stacked structure of ITO which is a transparent metal oxide, for example. The cathode 16 may be formed as a transparent electrode out of Mg, Ag, and others. The thickness of the electrode is 10 nm to 40 nm, for example.

The bank 14 is a wall for separating the light-emitting layer 13 for each light-emitting region 2 allowing individual driving for the light emission, and is made of a photo-sensitive resin.

The thin-film sealing layer 17 is made of silicon nitride, and has a function of blocking the light-emitting layer 13 and the cathode from moisture and oxygen. This is for preventing the light-emitting layer 13 itself and the cathode 16 from being degraded (being oxidized) by the exposure to the moisture and oxygen.

The sealing resin layer 19 is an acrylic or epoxy resin, and has a function of joining a layer integrally formed on the substrate from the planarizing film 10 to the thin-film sealing layer 17 and the transparent glass 18.

The stacked structure of the anode 11, the light-emitting layer 13, and the cathode 16 is the basic configuration of the organic EL device 1. With this configuration, when appropriate voltage is applied between the anode 11 and the cathode 16, the holes and the electrons are injected into the light-emitting layer 13 from the anode 11 side and the cathode 16 side, respectively. With the energy generated by the injected holes and electrons re-combined in the light-emitting layer 13, the luminescent material in the light-emitting layer 13 is excited and emits light.

Note that, the material for the hole injection layer 12 and the electron injection layer 15 are not limited in the present disclosure, and a known organic material or inorganic material is used.

Furthermore, with regard to the configuration of the organic EL device 1, the hole transport layer may be provided between the hole injection layer 12 and the light-emitting layer 13, and an electron transport layer may be provided between the electron injection layer 15 and the light-emitting layer 13. Alternatively, the hole transport layer may be provided instead of the hole injection layer 12, and an electron transport layer may be provided instead of the electron injection layer 15. The hole transport layer is a layer having a hole transporting material as a major component. Here, the hole transporting material with electron donor property is a material having a tendency to become positive ion (holes), and a property for transmitting the generated holes by charge transfer between molecules, and is a material suitable for transporting the electrons from the anode 11 to the light-emitting layer 13. The electron transport layer is a layer having an electron transporting material as a major component. Here, the electron transporting material is a material having an electron acceptor property and tendency to become negative ion, and transmits the generated electrons by the charge transfer between molecules, and is a material suitable for transporting the charges from the cathode 16 to the light-emitting layer 13.

Furthermore, the organic EL device 1 may further include color filters (light-adjusting layers) for adjusting the colors of red, green, and blue, under the transparent glass 18 to cover the light-emitting regions separated by the bank 14.

Note that, in the present disclosure, the hole injection layer 12, the light-emitting layer 13, and the electron injection layer 15 are collectively referred to as the organic layer 30. When the hole transport layer and the electron transport layer are included, these layers are also included in the organic layer 30. The thickness of the organic layer 30 is, for example, 100 nm to 200 nm.

Furthermore, one organic EL device 1 is composed by a planarizing film 10, the anode 11, the organic layer 30, the cathode 16, the thin-film sealing layer 17, the sealing resin layer 19, and the transparent glass 18 disposed in a light-emitting region 2 separated by the bank 14 and can be individually controlled for light-emission.

The organic EL panel (image display panel) is composed by arranging the organic EL device 1 in a matrix, and providing driving circuits each for controlling the light-emission from one of the organic EL devices 1. In this Specification, a part including one organic EL device and its corresponding driving circuit in the organic EL panel is referred to as a pixel.

In the organic EL device 1 illustrated in FIG. 1, a conductive foreign material 20 is included between the anode 11 and the cathode 16 in the fabrication process, and the anode 11 and the cathode 16 are short-circuited through the foreign material 20. The shorted part caused by the foreign material 20 is an example of the defective part of the light-emitting region 2.

In addition, in order to solve (repair) the defect due to the short-circuit between the anode 11 and the cathode 16 caused by the foreign material 20, an irradiation trace 16a is formed by irradiation of the laser beam on a part of the cathode near the foreign material 20. The details of the repair by the irradiation of the laser beam shall be described later.

Figure 2:
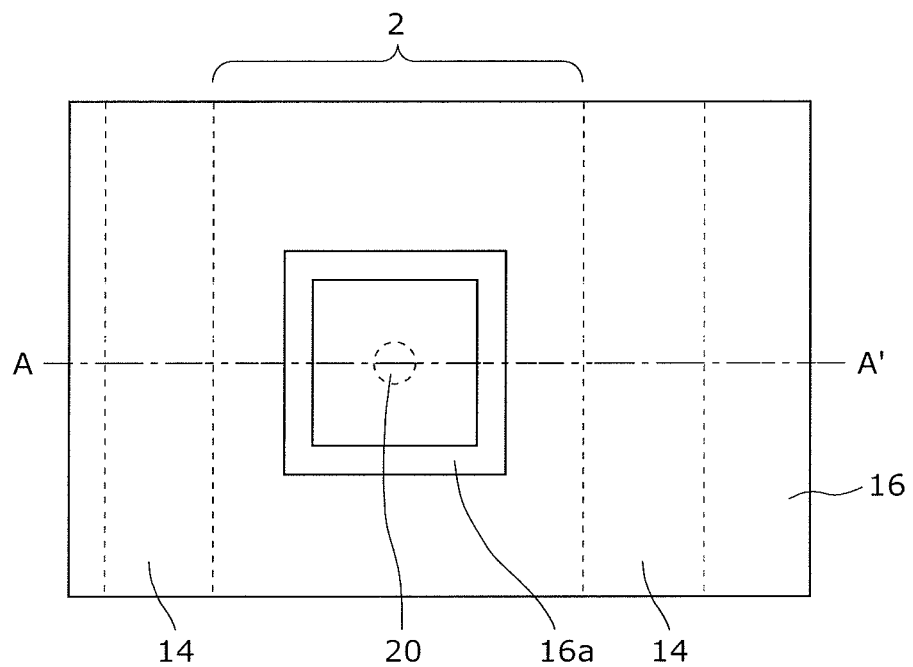
FIG. 2 is a top view of the organic EL device representing an example of a cathode having increased resistance.

FIG. 2 is a top view of the organic EL device 1, and illustrates a typical example of a position of the irradiation trace 16a in the plane, formed by the laser irradiation on the light-emitting region 2 having a shorted part by the foreign material 20. The AA' cross-section illustrated in FIG. 2 corresponds to FIG. 1.

The laser beam is emitted, tracing a closed path surrounding the shorted part of the cathode 16 due to the foreign material 20. For example, a square of 20 μm×20 μm is set in a periphery away from the foreign material 20 for approximately 10 μm, and an outline of the square may be irradiated with the laser beam. As a result, the irradiation trace 16a illustrated in FIG. 2 is formed in the cathode 16. The resistance value of the irradiation trace 16a is higher than the original resistance value of the cathode 16 which is not irradiated with the laser beam.

In the following description, the expression "increasing the resistance" refers to an action of irradiating a part to be irradiated with the laser beam so as to increase the resistance value of the part to be higher than the resistance value before the laser irradiation.

Fabrication Method

Next, a method for fabricating the organic EL device 1 shall be described. This fabrication method includes a process for solving the malfunction caused by the defective part of the organic EL device 1.

FIG. 3 is a flowchart illustrating the method for fabricating the organic EL device 1 according to the present disclosure.

First, the organic EL panel is prepared (S10). The organic EL panel includes pixels each of which includes the organic EL device 1 and a driving circuit for driving the organic EL device 1 arranged in a matrix. This process includes a process for stacking and forming the organic EL device 1 included in the pixels arranged in a matrix.

Next, the entire screen of the organic EL panel prepared in step S10 is turned on, and an entire-screen lighting test for selecting an organic EL panel having no problem with the screen display property is performed (S20).

Next, the organic EL panels selected in step S20 are tested for dark spot in the pixel and are repaired (S30).

First, the light-emitting region for each pixel is tested, and a shorted part in which the anode 11 and the cathode 16 are shorted in each light-emitting region is detected as a defective part (S40).

Next, the malfunction caused by the defective part detected in step S40 is repaired by laser irradiation (S50). The process in step S50 includes a recovery evaluation process which is characteristic process of the present disclosure for evaluating the organic EL device after the laser irradiation.

The following shall describe the processes described above in further detail.

First, the process for preparing the organic EL panel (S10) shall be described.

FIG. 4 is a partial cross-sectional schematic diagram of the organic EL panel prepared in the first process of the present disclosure. FIG. 4 illustrates a cross-sectional structure of the organic EL device 1A in which the anode 11 and the cathode 16 are shorted due to the foreign material 20.

First, the planarizing film 10 made of an insulating organic material is formed on a substrate including the TFT, and the anode 11 is subsequently formed on the planarizing film 10. The anode 11 is formed by depositing Al of 30 nm on the planarizing film 10 by the sputtering method, and a subsequent patterning process using the photolithography and the wet etching.

Next, the hole injection layer 12 is formed on the anode 11 by spin-coating the PEDOT solution including PEDOT dissolved in a solvent made of xylene.

Next, on the hole injection layer 12, the light-emitting layer 13 is formed by stacking α-NPD, Alq3 by the vacuum vapor deposition method.

Next, the electron injection layer 15 is formed on the light-emitting layer 13 by spin-coating Poly (p-phenylene vinylene) (PPV) dissolved in a solvent made of xylene or chloroform.

Subsequently, the cathode 16 is formed without exposing, in the air, the substrate on which the electron injection layer 15 is formed. More specifically, the cathode 16 is formed on the electron injection layer 15 by stacking indium tin oxide (ITO) for 35 nm by the sputtering method. Here, the cathode 16 is in an amorphous state.

With the fabrication process, the organic EL device having a function as a light-emitting device is formed. Note that, between the process for forming the anode 11 and the process for forming the hole injection layer 12, the bank 14 made of a resin with a photosensitive surface is formed at a predetermined position.

Next, the thin-film sealing layer 17 is formed on the cathode 16; by stacking silicon nitride for 500 nm using the plasma chemical vapor deposition (CVD) method, for example. Next, the thin-film sealing layer 17 is formed in contact with the surface of the cathode 16. Thus, the requirement for the protective film is strict, and a non-oxygen inorganic material represented as the silicon nitride described above is used, for example. In addition, for example, the thin-film sealing layer 17 may be formed of an oxygen inorganic material such as silicon oxide ($Si_xO_y$) and silicon oxynitride ($Si_xO_yN_z$), and a structure including multiple layers of the inorganic materials. Furthermore, the forming method is not limited to the plasma CVD method, and may also be other methods such as the sputtering method using argon plasma.

Next, the sealing resin layer 19 is applied on the surface of the thin-film sealing layer 17. Subsequently, the transparent glass 18 is provided on the sealing resin layer 19 applied. Here, the color filter (light-adjusting layer) is formed on the main surface of the transparent glass 18. In this case, the transparent glass 18 is provided on the sealing resin layer 19 applied, with the surface on which the color filters are formed is facing downward. Note that, the thin-film sealing layer 17, the sealing resin layer 19 and the transparent glass 18 serve as the protective layer.

Finally, the sealing resin layer 19 is cured by applying heat or energy line while applying pressure downward from the upper surface side of the transparent glass 18, bonding the transparent glass 18 and the thin-film sealing layer 17.

With the forming method described above, the organic EL device 1A illustrated in FIG. 4 is formed.

Note that, the process for forming the anode 11, the hole injection layer 12, the light-emitting layer 13, the electron injection layer 15 and the cathode 16 is not limited by the present disclosure.

Furthermore, there is a defective part due to the short-circuit in the light-emitting region 2 in the organic EL device 1A, that is, the shorted part between the anode 11 and the cathode 16 by the foreign material 20 mixed in the fabrication process.

Next, the entire screen lighting testing process (S20) shall be described.

In the entire screen lighting testing process, the organic EL devices in the entire screen of the organic EL panel prepared in step S10 is turned on for lighting for testing whether or not there is a problem in the display characteristics on the screen such as uneven luminance, linear display defect, and dark spots out of acceptable level. With this process, organic EL panels without any problem are selected, and disqualified panels are used as recycled parts or discarded.

Next, the process for specifying the defective part of the organic EL device (S40) in the defective pixel testing and the repair process for the organic EL device (S30) shall be described.

In FIG. 4, the foreign material 20 remains when Al, which is the material for the anode 11 is attached on the anode 11 after the anode 11 is formed, and the hole injection layer 12, the light-emitting layer 13, the electron transport layer 15, and the cathode 16 are subsequently stacked thereon. The size of the foreign material 20 is, for example, approximately a diameter of 200 nm and a height of 500 nm, for example. If there is a shorted part between the anode 11 and the cathode 16 by the foreign material 20, current which is supposed to drive the light-emission flows in the shorted part. Consequently, the light-emitting region 2 does not sufficiently emit light or emit light at all. The pixel corresponding to the light-emitting region 2 which lost a normal light-emitting function is referred to as a defective pixel.

Figure 5:
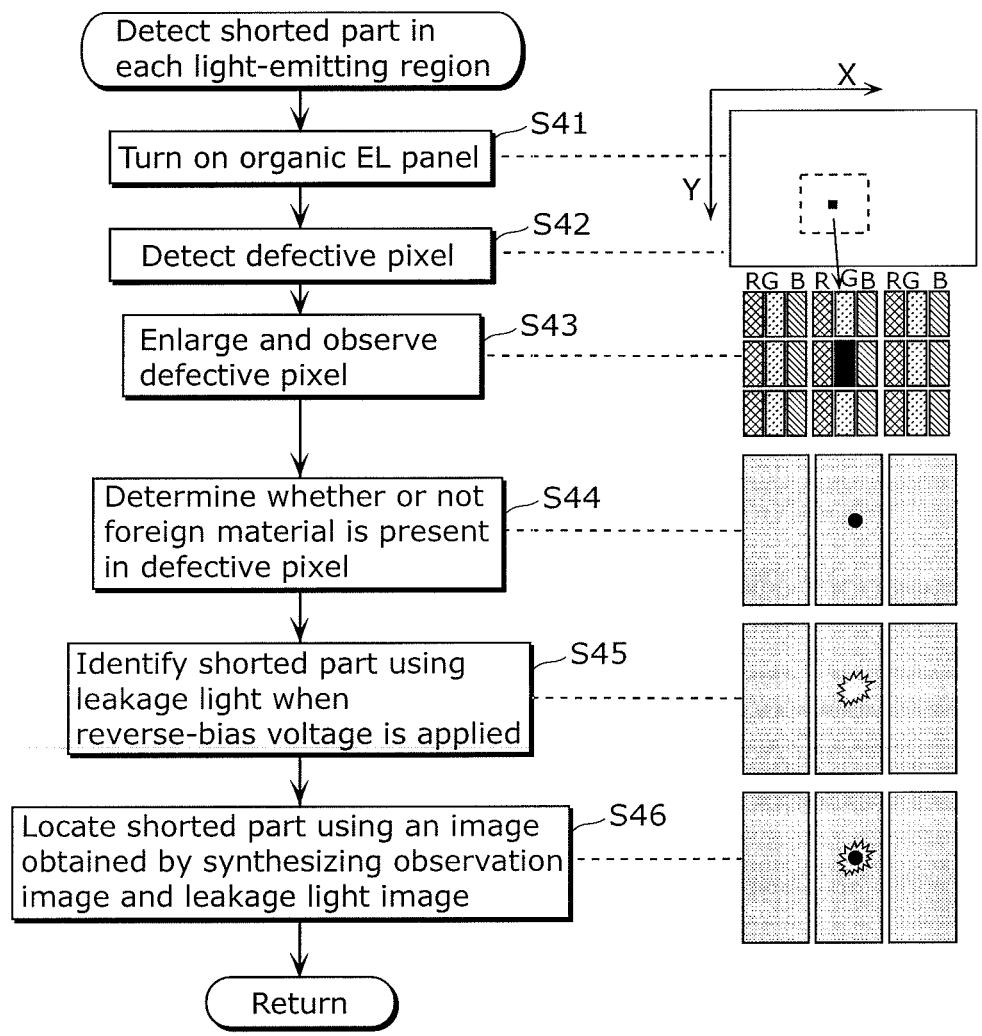
FIG. 5 is a flowchart illustrating an example of a process of detecting the shorted part of the light-emitting device according to the embodiment.

FIG. 5 is an operational flowchart for describing step S40 according to the embodiment.

First, the light on the organic EL panel selected at step S20 is turned on (S41). More specifically, a reverse bias voltage is applied to all of the pixels in the organic EL panel simultaneously by the driving circuit in the organic EL panel or by an external testing apparatus connected. Here, all of the pixels are captured by a CCD camera or others at the same time.

Subsequently, the luminance of the light emitted from each of the pixels is calculated based on the captured image in the reverse-bias voltage application period, and a pixel which is emitting light with luminance smaller than or equal to the predetermined threshold is detected as a defective pixel (S42).

Next, the detected defective pixel is enlarged and observed (S43). More specifically, the defective pixel is observed using a photomicrographic camera, for example.

Here, the foreign material 20 is identified in a region of the defective pixel enlarged for observation (S44).

Next, a reverse bias voltage is applied on the defective pixel detected in step S42, and a light-emitting point emitting leakage light is identified (S45). In the normal pixel, current does not flow in the organic EL device by the reverse bias voltage. However, in the light-emitting region having a shorted part, the leakage light emitted by the leakage current is observed in the shorted part. A point emitting the leakage light in the light-emitting region is identified by an image obtained by capturing the leakage light-emitting state.

More specifically, by driving circuits included in the organic EL panel, or by the external source meter connected, a predetermined reverse bias voltage is applied in the pixels to be tested. Subsequently, the point emitting light greater than or equal to threshold intensity in a period when a reverse bias voltage is applied is determined. Note that, since the leakage light emitted by applying a reverse bias voltage is weak, the image capturing by a CCD camera or others is performed in a completely light-shielded environment, for example. Subsequently, the intensity of light emitted from each imaging point is compared with a threshold. With this, whether or not there is leakage light-emission is determined. The leakage light emitting point is determined as described above.

Note that, as the CCD camera, a cooled CCD camera is used, for example. With this, even when imaging weak leakage light emitted from the organic EL device, it is possible to secure a predetermined S/N ratio. Accordingly, it is possible to eliminate the noise at the time of testing, thereby improving the accuracy of detecting the point emitting the leakage light.

Next, the position of the shorted part in the defective pixel is located by synthesizing the image of the defective pixel when the forward bias voltage is applied which is enlarged and observed at step S44, and the image of the leakage light-emitting point when the reverse-bias voltage is applied at step S45 (S46).

Note that, in the process for locating the shorted part in step S46, the position of the shorted part is located by matching the position of the foreign material located at step S44 and the position of the leakage light-emitting point located at step S45. Alternatively, the shorted part may be located by using only the position of the foreign material or the leakage light-emitting point.

Furthermore, detection of the light-emitting region having a shorted part is not limited to the method described above, and may be detected based on a current value by measuring a current value flowing between the anode 11 and the cathode 16 of the organic EL device. In this case, a current value equivalent to a normal pixel is obtained when the forward bias voltage is applied, and leakage light emission is observed when the reverse-bias voltage is applied may be determined as the defective pixel.

Next, a process (S50) of repairing the malfunction caused by the defective part of the organic EL device by irradiating the organic EL device with a laser beam shall be described. The process in step S50 includes a recovery evaluation process which is characteristic process of the present disclosure for evaluating the organic EL device after the laser irradiation.

Figure 6:
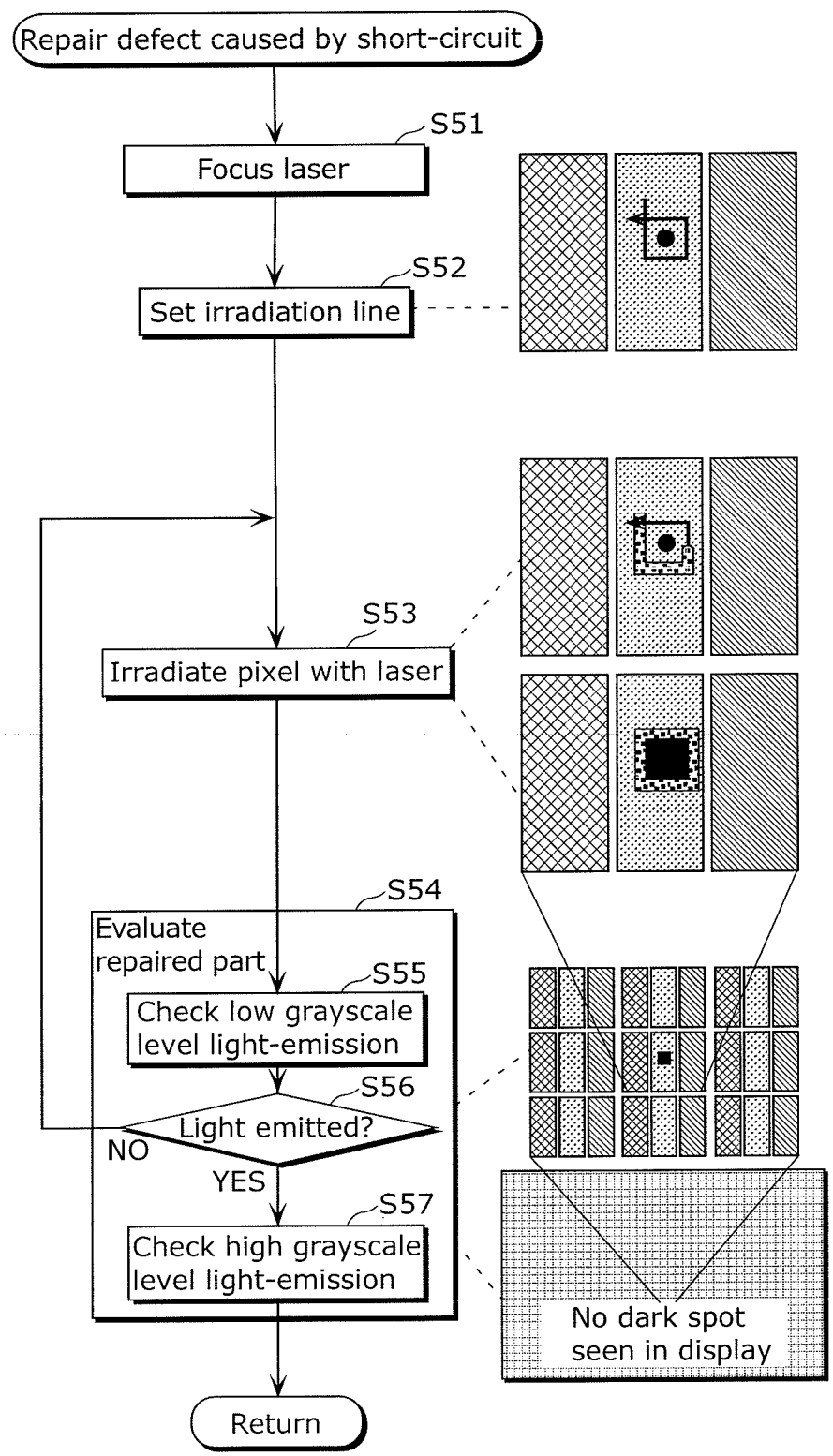
FIG. 6 is a flowchart illustrating an example of the process for repairing a defect caused by the short-circuit according to the embodiment.
Figure 7:
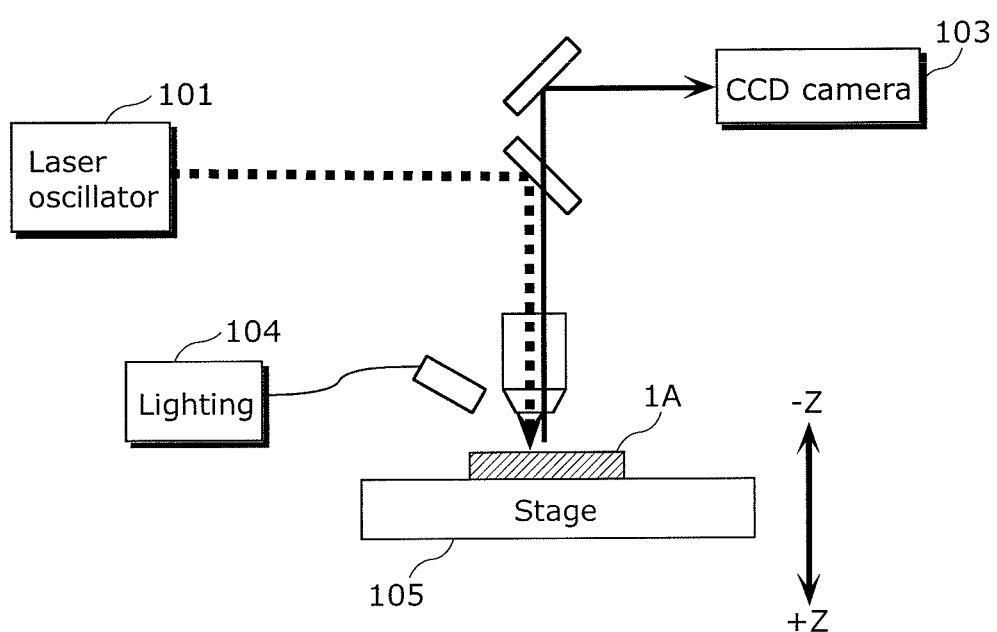
FIG. 7 is a structural diagram illustrating an example of a system for performing laser repairing according to the embodiment.

FIG. 6 is an operational flowchart for describing step S50 according to the embodiment. FIG. 7 is a structural diagram illustrating an example of a system for performing laser repairing according to the embodiment. The system illustrated in FIG. 7 includes a laser oscillator 101, a CCD camera 103, a lighting 104, and a stage 105. Furthermore, the organic EL panel having the organic EL device 1A, an item in fabrication process, is disposed and fixed on the stage 105.

The laser oscillator 101 can emit a laser beam having an ultrashort pulse with a wavelength of 750 nm to 1600 nm, output energy of 1 µJ to 30 µJ, and a pulse width in the order of a few femtoseconds to a few picoseconds. The ultrashort pulse laser includes a femtosecond laser, for example, and a suitable range of the pulse is 100 fs to 20 ps. By the irradiation of the ultrashort pulse laser, it is possible to increase the resistance of the component of the anode or cathode in the amorphous state. Furthermore, the resistance of the transparent conductive material which cannot be easily processed using the other laser can be increased.

In this embodiment, the resistance in a part of the cathode 16 is increased by focusing the laser on the cathode 16. Here, the range of the output energy capable of increasing the resistance of the part of the cathode 16 is dependent on the wavelength of the laser beam emitted. When the cathode 16 is irradiated with a laser having excessive output energy, the laser beam reaches the organic layer 30 provided under the cathode 16, damaging the organic layer 30. If the cathode 16 is irradiated with a laser beam having insufficient energy, the resistance in the cathode 16 does not increase. If the cathode 16 is irradiated with a laser beam having a pulse width greater than or equal to 20 psec, the organic layer 30 will be damaged. In view of the above, in the range of the laser wavelength, and by irradiating the organic EL device with a laser having a pulse width in a range of the pulse width allows increase the resistance in part of the cathode 16 easily.

The CCD camera 103 captures the organic EL panel on the stage 105.

The lighting 104 emits supplemental light necessary for imaging the organic EL panel.

The stage 105 is used for placing the organic EL panel, is movable in the height direction Z, and the planar directions X and Y, and positions an area of the organic EL device to be irradiated with the laser.

The following shall specifically describe the repair process (S50) with reference to the flowchart in FIG. 6.

First, the height of the part of the organic EL device to be irradiated with laser (irradiated part) is set (S51). More specifically, the position of the stage 105 in the depth direction Z is adjusted such that the focus of the laser beam is on the cathode 16 in the organic EL device 1A.

Next, the irradiation line of the laser beam is set (S52). More specifically, as illustrated in FIG. 2, the irradiation line in the plane to be traced by the laser beam is set in a position defined as a closed path surrounding the shorted part of the cathode 16 due to the foreign material 20 (for example, on the outline of a square of 20 μm×20 μm defined at a periphery approximately 10 μm away from the foreign material in the cathode 16). The area surrounded by the irradiation line is smaller than or equal to one third of the area of the light-emitting region 2, for example. In addition, in order to securely form a closed path with the irradiation trace, a part of the irradiation line near the starting point and a part of the irradiation line near the end point may cross each other.

Next, the first laser irradiation process of irradiating the organic EL panel with a laser is performed, tracing the irradiation line set in step S52 at the height of the stage 105 determined at step S51 (S53).

Next, with the laser irradiation described above, the organic EL panel is evaluated as to whether or not the light-emitting function of the defective pixel has recovered (S54).

In the recovery evaluation process at step S54, first, a low grayscale level light-emission checking process of measuring luminance of light emitted from the organic EL device after the organic EL device is irradiated with the laser beam, while supplying, to the organic EL device, a first amount of current with which the organic EL device in a normal state would emit light having luminance corresponding to a first grayscale level smaller than a reference grayscale level is performed (S55), and if the measured luminance is smaller than a threshold for determination (No in S56), the process returns to step S53, and the second laser irradiation process for irradiating the organic EL device with a laser beam again is performed.

If the luminance measured at step S55 is greater than or equal to the determination threshold (Yes in S56), a high grayscale level light-emission checking process of measuring luminance of light emitted from the organic EL device when the luminance measured in step S55 is greater than or equal to the determination threshold, while supplying, to the organic EL device, a second amount of current with which the organic EL device in the normal state would emit light having luminance corresponding to a second grayscale level greater than or equal to the reference grayscale level is performed (S57). The high grayscale level light-emission checking process is performed in the same manner as a typical conventional recovery checking test.

Examples of the effects of the recovery evaluation process described above, and a suitable example of the first grayscale level, the second grayscale level, and the threshold for the determination shall be described with reference to FIGS. 8 (a) and (b), and FIG. 9A and FIG. 9B.

As described above, the inventors noticed that there is an organic EL device which emits light with extremely low luminance when a luminance signal of lower grayscale level is given, even if the conventional high-grayscale level light emission test confirms that the maximum acceptable light-emission luminance has been recovered.

In order to consider the measures on the problem, the inventors conducted an experiment for measuring the light-emitting characteristics of multiple organic EL devices determined as emitting light having acceptable maximum luminance after laser irradiation. In this experiment, current corresponding to every one of 256 grayscale levels from 0 (light off) to 255 (maximum luminance) was sequentially supplied to the organic EL device, and the luminance corresponding to each grayscale level was measured.

Figure 8:
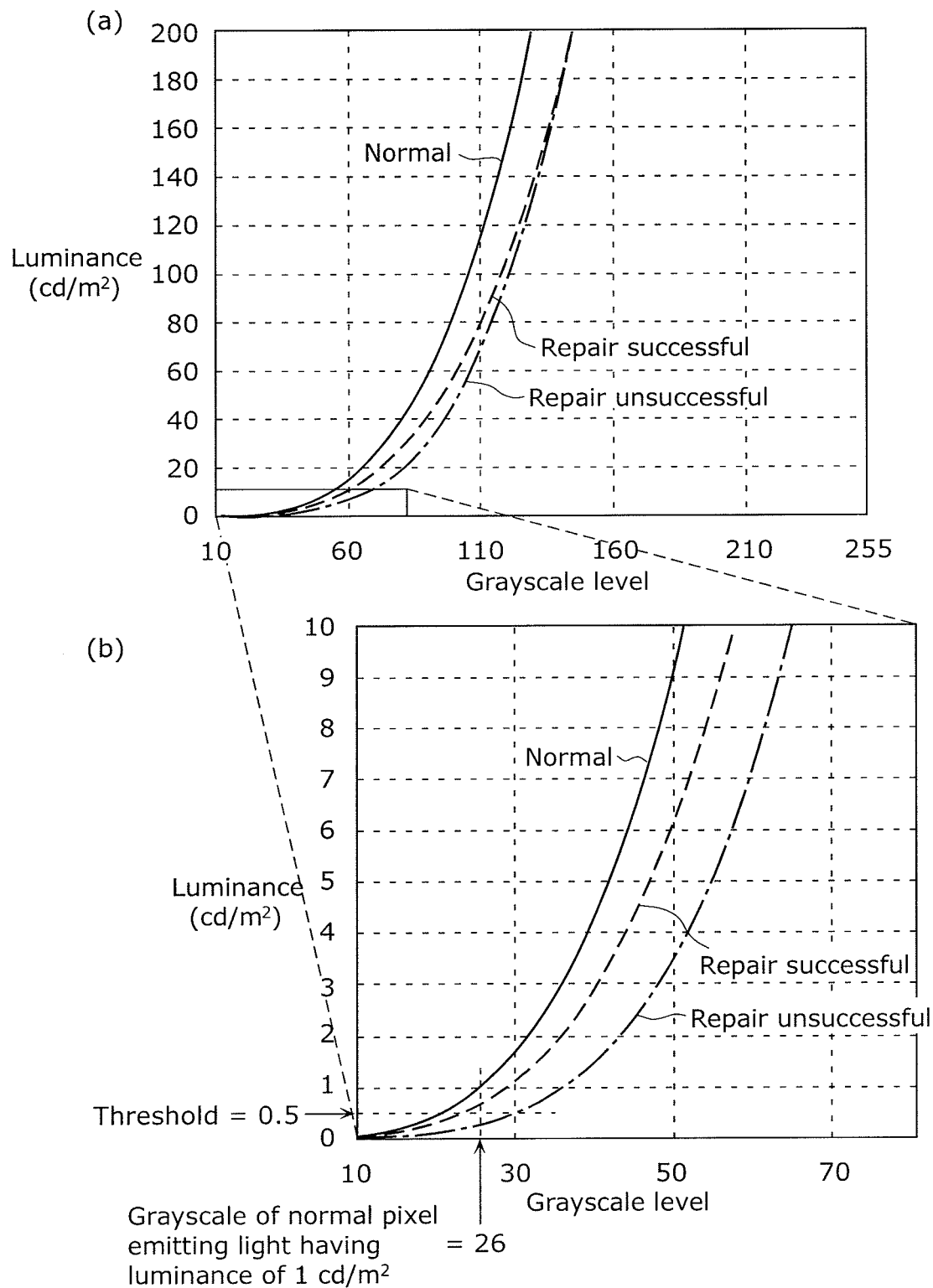
FIG. 8 (a) is a graph illustrating an example of the light-emission characteristics of the organic EL device in states including normal, repair successful, and repair unsuccessful.

FIG. 8 (a) is a graph illustrating an example of the light-emission characteristics of the organic EL device illustrating the states including normal, repair successful, and repair unsuccessful. FIG. 8 (b) is a graph illustrating the low grayscale level part of FIG. 8 (a) enlarged.

Among these graphs, the graph indicated as normal indicates the designed luminance value of the pixel emitting light by a supply of the current corresponding to each grayscale level if the organic EL device is normal. The regular organic EL device without light emission malfunction caused by the short-circuit emits light mostly following the light emission property described above.

In addition, the graphs marked as repair successful and repair unsuccessful illustrate light-emitting characteristics measured on an organic EL device with recovered luminance in low grayscale level and light-emitting characteristics measured on an organic EL device with non-recovered low grayscale level luminance, among the organic EL devices with acceptable maximum light emission luminance recovered.

As illustrated in FIG. 8 (a), with a grayscale level greater than or equal to level 140, both the organic EL devices whose repair is successful or unsuccessful indicate the same light-emission characteristics. Although the illustration of the light-emission characteristics greater than or equal to 200 cd/m$^2$ is omitted, it is confirmed that the organic EL device emits light having luminance greater than or equal to half the luminance of the normal EL device when the current corresponding to the maximum grayscale level is supplied. Accordingly, the organic EL devices pass the high-grayscale level light-emission test in which the threshold for the determination is set to be 50% of the normal luminance. However, as illustrated in FIG. 8 (b), when the grayscale level is lower than or equal to level 50, the luminance of the light emitted from the organic EL device whose repair was unsuccessful remains in less than half the luminance of the normal organic EL device.

The inventors assumed that the cause of the difference in the light-emission characteristics is in the difference in the level of increased resistance at the shorted part by the laser irradiation, and considered the following issues.

Figure 9A:
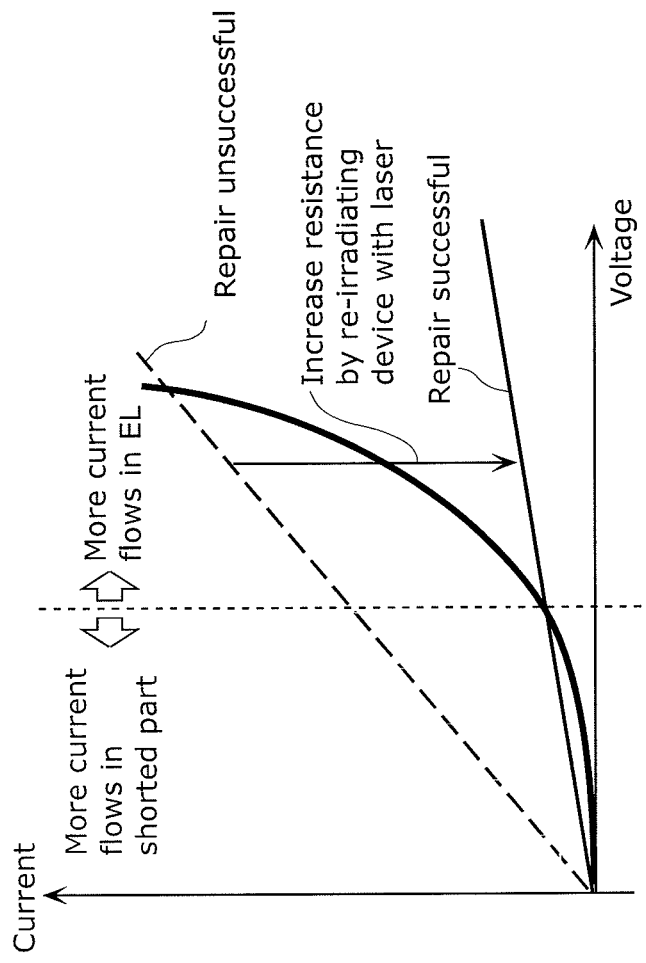
FIG. 9A is an equivalent circuit diagram of the organic EL device having a shorted part due to a foreign material.
Figure 9B:
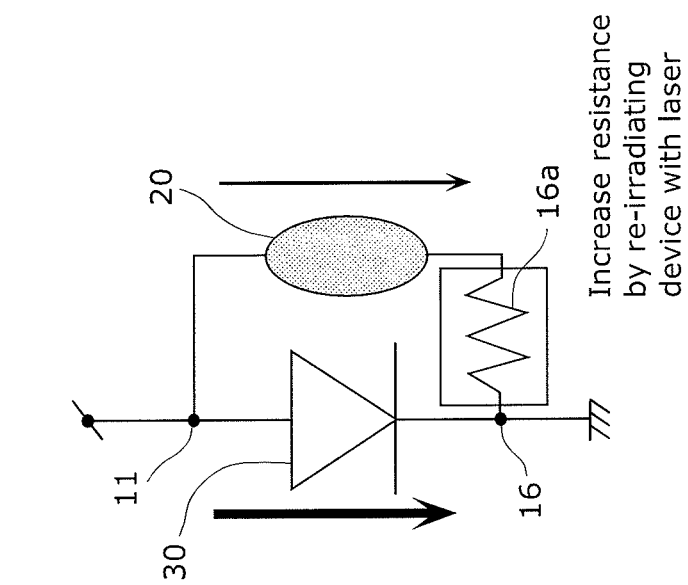
FIG. 9B is a graph illustrating an example of current-voltage characteristics of the organic EL device having a shorted part due to the foreign material.

FIG. 9A is an equivalent circuit diagram of the organic EL device having a shorted part by the foreign material, and FIG. 9B is a graph illustrating an example of the current-voltage characteristics of the organic EL device having a shorted part caused by the foreign material.

In FIG. 9A and FIG. 9B, the thick line illustrates current flowing in the organic layer 30. The organic layer 30 has non-linear current-voltage characteristics as a diode. The fine lines illustrate current flowing in the shorted part caused by the foreign material 20. The shorted part has a resistance value dependent on the resistance value of the irradiation trace 16a after the laser irradiation. Here, the graphs in the fine broken line and the fine solid line are models for a case in which the increased resistance of the shorted part by the laser irradiation is insufficient (repair unsuccessful) and sufficient (repair successful).

As illustrated in FIG. 9B, when the organic EL device is driven by large current, that is, when the organic EL device emits light in high grayscale level, the current flowing in the organic layer 30 is dominant, and thus the insufficient resistance on the shorted part is not evident. On the other hand, when the organic EL device is driven at small current, that is, when the organic EL device emits light in a low grayscale level, the current flowing in the shorted part is dominant. Consequently, the organic EL device in which the resistance at the shorted part is not sufficiently increased does not emit light at all or emits light in extremely low luminance. This aspect matches the phenomenon found by the inventors very well.

Based on the speculation described above, the inventors devised a method in which the repair method described in the flowchart of FIG. 6. More specifically, first, the light-emission checking at low grayscale level is performed on the organic EL device after the laser irradiation. When the desired luminance is not obtained at the low-grayscale level light emission checking, the high-grayscale level light emission checking which is the typical recovery checking test is performed after increasing the resistance values of the irradiation trace.

As illustrated in FIG. 6, when irradiating the laser at step S53, no light is emitted from the defective pixel when the forward bias voltage is applied until the tracing of the irradiation line by the laser beam is complete and the irradiation trace becomes a closed path.

Subsequently, when the tracing of the irradiation line is complete, although the region surrounded by the irradiation trace does not emit light by the application of the forward bias voltage, the other light emission from the other region can be observed. When this phenomenon is observed on the entire organic EL light-emitting panel, even if the region which is a square of 20 μm×20 μm does not emit light, the non-light emitting region is not visualized, thereby solving the malfunction in light emission caused by the short-circuit.

Subsequently, in the recovery evaluation process at step S54, prior to the conventional high grayscale level light-emission checking for measuring the high-grayscale level light-emission luminance (S57), the low-grayscale level light-emission checking in which the luminance of emitted light in low grayscale level is performed (S55). If the measured luminance is lower than the threshold for the determination (No in S56), the process returns to step S53, and an attempt to increase the resistance in the device by irradiating the device with the laser beam again is performed. Accordingly, the possibility of missing the light-emission defect in the low grayscale level is reduced compared to the conventional technology, allowing a repair of the organic EL device with higher accuracy.

Here, the threshold used for the determination at step S56 may be 50% of the luminance corresponding to the first grayscale level when the organic EL device is normal. The organic EL device having a luminance of the light less than half the luminance of the normal organic EL device is especially likely to be recognized by the user. Accordingly, it is effective to select such an organic EL device and attempt the re-repair by the laser re-irradiation.

The first grayscale level may be the first grayscale level is a grayscale level corresponding to the light emitted from the organic EL device in the normal state having a luminance of 1 cd/m² (for example, level 26). The luminance 1 cd/m² of the light emitted is an example of the upper limit value of the luminance substantially recognized as black by the user, and the user recognizes light with any luminance lower than or equal to 1 cd/m² as black.

Accordingly, in the grayscale level with which the normal organic EL device would emit light having luminance of 1 cd/m², if the luminance of the light emitted from the organic EL device after repair is recovered to 50% of the normal luminance, that is, at 0.5 cd/m², it is acceptable to have insufficient luminance of light emitted from the repaired organic EL device in a lower grayscale level which is simply recognized as black by the user.

Note that, the upper limit value of the luminance substantially recognized as black uniformly by the user significantly differs depending on the capacity, usage, and use environment of the display apparatus including the organic EL panel incorporated therein. Accordingly, the specific value of the first grayscale level should be appropriately selected depending on the capacity, usage, and use environment of the display apparatus.

The second grayscale level may be the grayscale level near the maximum grayscale level of the organic EL device. The high-grayscale level light-emission test performed near the maximum grayscale level checks whether the maximum light emission luminance greater than or equal to the acceptable threshold is restored in the organic EL device after the laser irradiation, and also serves as a tolerance test for checking whether or not the tolerance of the organic EL device is damaged by the laser irradiation. Accordingly, this is significantly helpful for simplifying and increasing the efficiency of the repair process.

Although only some exemplary embodiments of the present disclosure have been described in detail above, those skilled in the art will readily appreciate that many modifications are possible in the exemplary embodiments without materially departing from the novel teachings and advantages of the present invention. Accordingly, all such modifications are intended to be included within the scope of the present disclosure.

For example, in the embodiment described above, a configuration in which the lower electrode is the anode and the upper electrode is the cathode is described. However, the lower electrode may be the cathode, and the upper electrode may be the anode. In addition, the planarizing film, the anode, the hole injection layer, the light-emitting layer, the bank, the electron injection layer, the cathode, the thin-film sealing layer, the sealing resin layer and the transparent glass included in the organic EL device may not be limited to the configuration described the embodiment. The materials, the configurations, and the forming methods may be changed. For example, the hole transport layer may be provided between the hole injection layer and the light-emitting layer, and the electron transport layer may be provided between the electron injection layer and the light emitting layer. Furthermore, the color filters for adjusting the colors in red, green, and blue may be provided under the transparent glass to cover the light-emitting regions separated by the bank. The femtosecond laser described above can pass through the color filters. Accordingly, it is possible to solve the short-circuit through the color filters.

Furthermore, the irradiation position of the laser may not be limited to the embodiment described above, but may be set in a predetermined range including the foreign material or shorted part, or only on the foreign material or the shorted part. Alternatively, the irradiation position may be set to surround the periphery of the foreign material or the shorted part. Furthermore, the laser irradiation may not be limited on the cathode, but may be performed on the anode.

Figure 10:
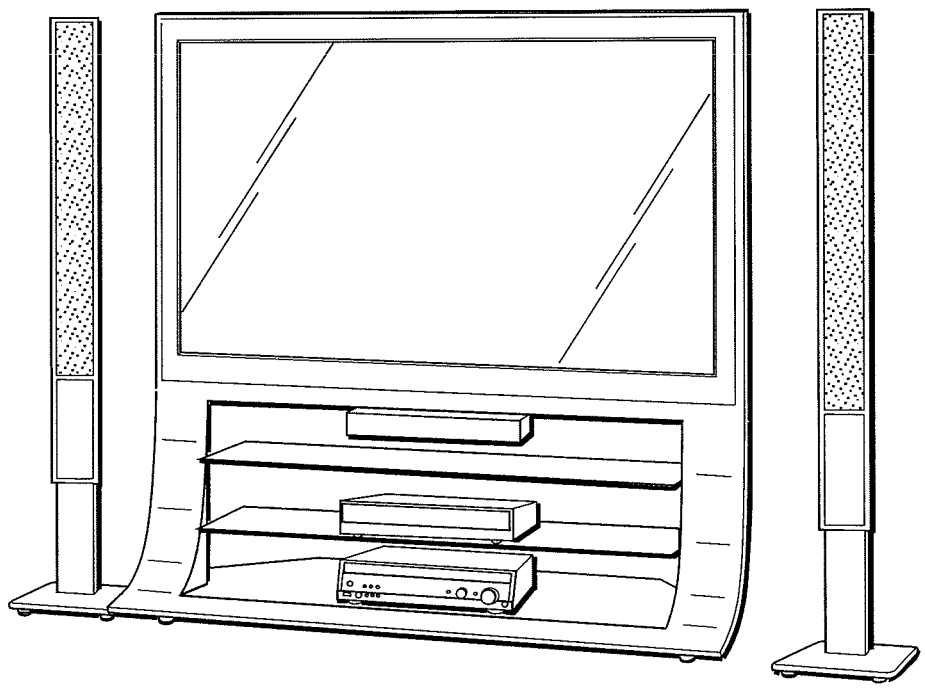
FIG. 10 is an external view of a television system having the organic EL device according to the present disclosure.

The present disclosure is suitable for fabricating the thin-flat television system having the organic EL device illustrated in FIG. 10, for example.

INDUSTRIAL APPLICABILITY

The organic EL device and the method for fabricating the organic EL device according to the present disclosure is applicable to the technology fields such as flat-panel television or displays for personal computers, where there is a demand for increased size of the screen and a higher resolution.

The invention claimed is:

1. A method for fabricating an organic electroluminescence (EL) device, the method comprising:
   irradiating an organic EL device having a defective portion with a laser beam;
   measuring first luminance of light emitted from the organic EL device after the organic EL device is irradiated with the laser beam, while supplying, to the organic EL device, a first amount of current with which the organic EL device in a normal state would emit light having luminance corresponding to a first grayscale level smaller than a reference grayscale level;
   re-irradiating the organic EL device with the laser beam when the first luminance measured in the measuring is smaller than a determination threshold; and
   measuring second luminance of light emitted from the organic EL device when the first luminance measured in the measuring is greater than or equal to the determination threshold, while supplying, to the organic EL device, a second amount of current with which the organic EL device in the normal state would emit light having luminance corresponding to a second grayscale level greater than or equal to the reference grayscale level.

2. The method for fabricating the organic EL device according to claim 1,
   wherein the determination threshold for the first luminance is 50% of luminance corresponding to the first grayscale level of the light emitted from the organic EL device in the normal state.

3. The method for fabricating the organic EL device according to claim 1,
   wherein the first grayscale level is a grayscale level corresponding to the light emitted from the organic EL device in the normal state having a luminance of 1 cd/m$^2$.

4. The method for fabricating the organic EL device according to claim 1,
   wherein the second grayscale level is a grayscale level around a maximum grayscale level of the organic EL device.

* * * * *